(12) United States Patent
Bronner et al.

(10) Patent No.: US 6,265,308 B1
(45) Date of Patent: *Jul. 24, 2001

(54) SLOTTED DAMASCENE LINES FOR LOW RESISTIVE WIRING LINES FOR INTEGRATED CIRCUIT

(75) Inventors: Gary B. Bronner, Stormville; Greg Costrini, Hopewell Junction; Carl J. Radens, Poughkeepsie; Rainer F. Schnabel, Wappingers Falls, all of NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/201,205

(22) Filed: Nov. 30, 1998

(51) Int. Cl.$^7$ .................................................. H01L 21/4763
(52) U.S. Cl. ........................ 438/637; 438/638; 257/758
(58) Field of Search ...................................... 438/637, 622, 438/638, 675; 257/750, 758, 773

(56) References Cited

U.S. PATENT DOCUMENTS

| | | | |
|---|---|---|---|
| 4,721,689 | 1/1988 | Chaloux, Jr. et al. | 437/189 |
| 4,840,923 | 6/1989 | Flagello et al. | 437/189 |
| 5,091,339 | 2/1992 | Carey | 437/225 |
| 5,093,279 | 3/1992 | Andreshak et al. | 437/173 |
| 5,539,227 | 7/1996 | Nakano | 257/276 |
| 5,554,864 | 9/1996 | Koyama | 257/211 |
| 5,565,384 | 10/1996 | Havemann | 437/228 |
| 5,581,097 | 12/1996 | Nariishi | 257/208 |
| 5,614,765 | 3/1997 | Avanzino et al. | 257/774 |
| 5,635,423 | 6/1997 | Huang et al. | 437/195 |
| 5,801,094 | 9/1998 | Yew et al. | |
| 5,932,928 | * 8/1999 | Clampitt | 257/758 |

FOREIGN PATENT DOCUMENTS

| | | |
|---|---|---|
| 0 224 013 | 6/1987 | (EP) . |
| 0 463 956 | 1/1992 | (EP) . |
| 0 558 004 | 9/1993 | (EP) . |

OTHER PUBLICATIONS

Wolf, Silicon Processing for the VLSI Era, vol. 2: Process Integration, Academic Press: New York, pp. 180–182, 238–239, 245, 252,260. 1990.*
European Search Report dated Feb. 29, 2000.

* cited by examiner

*Primary Examiner*—Charles Bowers
*Assistant Examiner*—Erik Kielin
(74) *Attorney, Agent, or Firm*—McGinn & Gibb, PLLC; Eric W. Petraske, Esq

(57) ABSTRACT

A process of forming a wiring in a semiconductor interlayer dielectric, include simultaneously patterning a via and a slotted line in the interlayer diectric, simultaneously etching the via and the slotted line, and simultaneously filling the via and the slotted line with a metal.

25 Claims, 3 Drawing Sheets

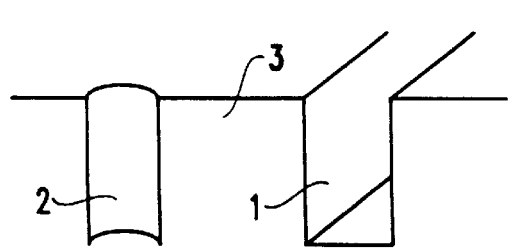
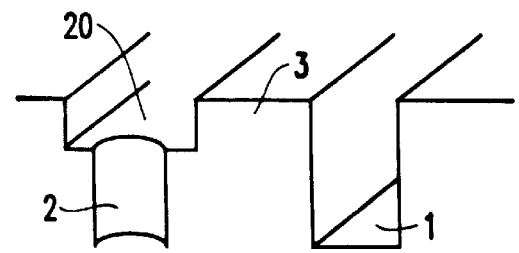
FIG.1  FIG.2
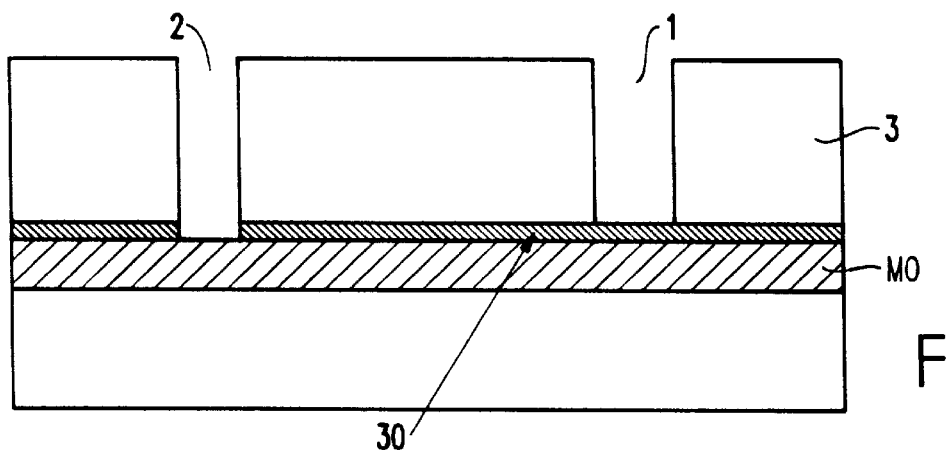
FIG.3
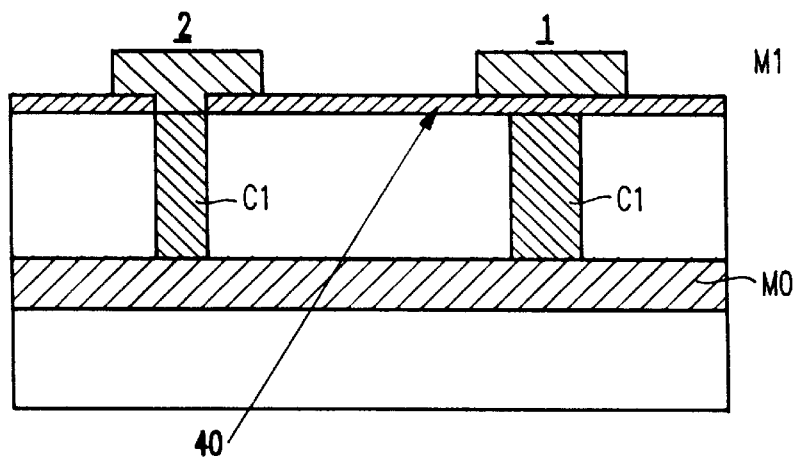
FIG.4
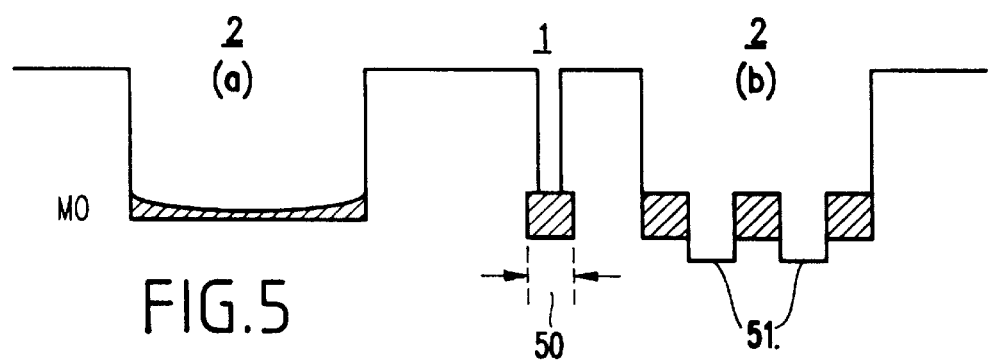
FIG.5

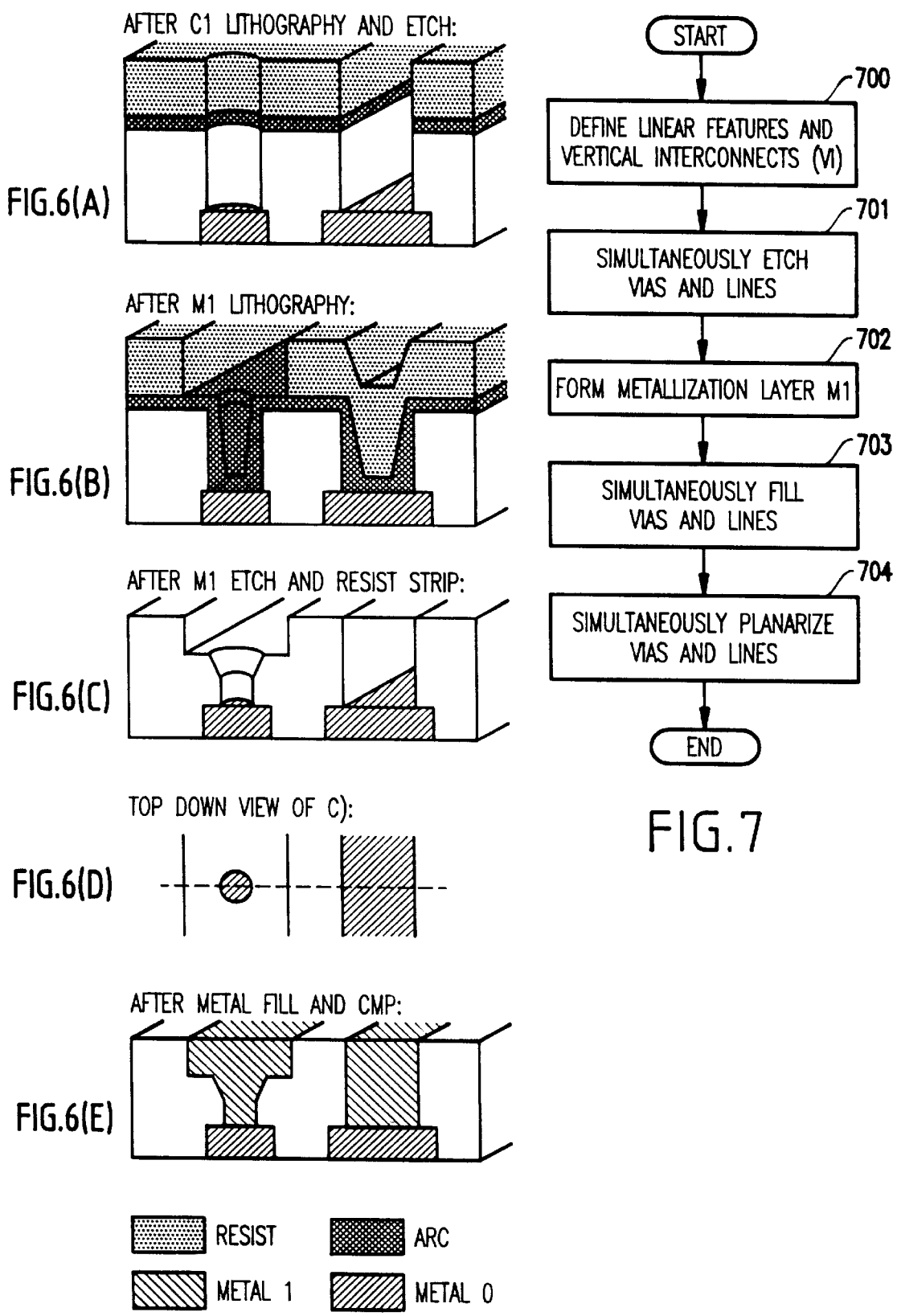

SLOTTED DAMASCENE LINES FOR LOW RESISTIVE WIRING LINES FOR INTEGRATED CIRCUIT

BACKGROUND OF THE INVENTION

1. Field of the Invention

The present invention generally relates to integrated circuits (ICs), and more particularly to a structure and method for forming wiring lines for the integrated circuits and relates to an interconnect scheme forming an additional type of metal lines without additional mask levels.

2. Description of the Related Art

In DRAM circuits, the need for multiple metal levels is driven by the requirement to increase the array efficiency with increasing memory size. Three metal levels are conventionally used as bitline, master or stitched wordline and column select lines.

Recently, several hybrid or hierarchical bitline architectures have been proposed in order to decrease the number of sense amplifiers. These architectures require an additional metal level. Simultaneously, DRAM support circuits also need multiple wiring levels for area reduction. Low resistance is the main requirement for the support circuits, in particular for power bussing.

By the same token, low capacitance is important for the use as bitlines or master bitlines in the array.

Conventional interconnection architecture for integrated circuits typically includes horizontal lines of various materials (e.g., metal silicides, W, Al, Cu, and the like), and vertical vias between the horizontal interconnect levels (e.g., M1, M2 wiring levels which are horizontal).

The vias are typically etched into the interlevel dielectric (ILD) formed, for example, of $SiO_2$, and subsequently are filled by chemical vapor deposition (CVD) or plasma vapor deposition (PVD) metal such as, for example, W, Al, Cu, and the like.

Thus, conventionally linear and circular patterns are defined by lithography and etching for the horizontal (HI) and vertical (VI) interconnect levels, respectively, and the vertical interconnect levels (VI) are limited to vias.

The resistance of metal lines is defined by height, width and resistivity. The height is often limited by arrays of smallest feature size (e.g., memory arrays). Due to capacitance and space minimization in these areas, the height of the metal lines is strongly limited. On the other hand, the use of lines with large line width leads to an increased chip size. Consequently, the resistance of metal lines is globally restricted to values which do not allow for high current densities due to Joule heating of highly, resistive lines.

Thus, power bus lines, designed to carry high current densities, and signal or equipotential lines that do not allow a large potential gradient along the line, are typically designed on an additional metal level using a thicker metal height, or using broad or parallel lines on thin metal levels, thereby increasing chip size.

Hence, if thicker metal lines are desired for increased current capacity (and thus higher bus speeds for example), then the conventional techniques for producing thick metal lines include increasing the thickness of the metal layer and increasing the number of metal layers, each of which increases chip size and processing steps.

Moreover, for a given combination of conducting and insulating materials, the only way to significantly reduce the capacitance of metal lines with narrow spacing is to make the metal stack sufficiently thin. Similarly, low resistance lines are produced by increasing their thickness accordingly. However, conventionally, both characteristics cannot be united on one metal level.

In a typical multi-layer metallization sequence, thin metal layers (e.g., bitline levels for DRAMs) are built first and then thick ones are built last. Consequently, the first metal levels are not useful for low resistance requirements. This has resulted in a significant limitation for a chip-size-optimized interconnect design. Moreover, the tradeoff between low capacitance and low resistance requirements is enhanced when the number of thin metal layers is increased as proposed recently for multiple bitline architectures.

SUMMARY OF THE INVENTION

In view of the foregoing and other problems and drawbacks of the conventional structures and method, an object of the present invention is to provide a structure and method for producing integrated circuits having multilayers ($\geq 2$) of metallization.

Another object is to simultaneously define linear features on a vertical interconnect level (C1) in addition to the circular vertical interconnects.

Yet another object is to form a low resistive horizontal interconnect (HI) with a height of the interlayer dielectric level (ILD) thickness.

Still another object of the present invention is to make vertical level interconnects with slotted lines.

In a first aspect, a method according to the present invention for forming interlayer wiring in a semiconductor interlayer dielectric, includes simultaneously patterning a via and a slotted line in the interlayer dielectric, simultaneously etching the via and the slotted line; and simultaneously filling the via and the slotted lines with a metal.

In a second aspect, a method of forming a metal wiring in a semiconductor device, according to the present invention, includes simultaneously defining a linear feature on a vertical interconnect level and a vertical interconnect in a substrate of the semiconductor device, simultaneously forming a line and a via in the substrate, simultaneously etching the line and the via, simultaneously filling the line and the via with a metal, to form the linear feature and the vertical interconnect, and planarizing the linear feature and the vertical interconnect.

The present invention realizes thick metal lines for high current and low potential gradient purposes by extending vias (e.g., vertical interconnects) to lines (horizontal interconnects) with no increase in process cost and a savings in chip size. The concept of slotted lines can be applied to different layers such as, for example, CG (contact-to-gate), CD (contact-to-diffusion layer) and C1 (contact between metals).

Moreover, slots and vias can be formed simultaneously with the same depth. Both features are positioned between two given levels of horizontal metal wires (e.g., M0 and M1). The vias are vertical interconnects, but the slots are horizontal interconnects with a resistivity much lower than M0 or M1. In addition to the formation of the slots, for example, between M0 and M1, another lithography and etch step will be used to define the upper metal level M1.

Hence, the present invention forms vias and line and obtains the additional feature of a low resistivity interconnect by combining circular and linear features on one mask (e.g., using a same mask). Thus, the invention forms a relatively thick wire out of the combined metal and via troughs in a dual damascene process. With the relatively thicker wire, a higher current (and thus a higher speed data bus) can be used.

Hence, the invention provides a processing which allows the formation of both, low capacitance metallization (e.g., in an array of lines) and low resistance metallization (e.g., in support circuits) simultaneously and without increasing cost or complexity.

Further, it will not be necessary to contact the M0 level, and indeed the underlying M0 could be eliminated.

Thus, the invention results in the capability of using a higher current without increasing the number of metal layers (e.g., non-increase in process cost) and chip size. Thus, there will be an increase in the dies per wafer.

Moreover, the present invention provides a unique method which allows building simultaneously thin and thick metal lines without adding any extra layers.

A key feature of the process is extending vias, which are conventionally used for vertical interconnects into lines that serve now as low resistance horizontal interconnects. These "slotted vias" can be capped with a line of the subsequent metal level (M1) and can fully land on a metal line formed on the preceding metal level (M0). Thus, the total metal height extends from the bottom of M0 to the top of M1 and in a preferred implementation may amount to a total height of about 900 nm.

In one implementation using, for example, Al metallization for the via and the M1 line, the slotted vias have exhibited a sheet resistance of around 0.04 $\Omega$/sq which makes them very suitable for low resistance horizontal interconnects. At the same time, M0 and M1 can both have thin metal stacks and therefore can be used, for example, as interconnects for capacitance limited devices.

Thus, the combination of regular lines and slotted vias simultaneously allows formation of low capacitance/high resistance lines as well as low resistance/high capacitance lines.

Further, since cost minimization is a key element for very-large-scale-integrated (VLSI) fabrication and DRAMs in particular, the introduction of new design features such as slotted vias is particularly advantageous since a significant reduction in chip area is made possible. It is noted that for the sake of minimizing total cost, the process presented below focuses on integrating slotted vias into an existing process flow without any major modifications. As described below, for a certain range of line widths, the introduction of slotted vias basically comes "for free". Specifically, no additional mask levels are required.

In one implementation, slotted vias have been integrated into a four level metallization scheme used in a 1 Gb DRAM chip. Three out of the four levels contained tight pitch arrays of 0.35 $\mu$m periodicity and were realized with dual damascene techniques (M0:W, M1 Al, M2:Al). Slotted vias were introduced in both Al dual damascene levels (M1 and M2). Consequently, the total chip area could be reduced by approximately 1%.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a schematic diagram of a via and a slotted line after simultaneous oxide etching;

FIG. 2 is a diagram of a via and slotted line after a trench etch (e.g., M1 trench etch in the case of an M1 dual damascene approach);

FIG. 3 is a diagram of a via and a slotted line in the case of an underlying insulating layer and shows a modification of the process of the invention shown in FIGS. 1 and 2;

FIG. 4 is a diagram of a via and a slotted line with a subsequent insulating layer etch stop layer in the case of an M1 metal etch process, and shows another modification to the process of the invention;

FIG. 5 shows in a left-hand portion a landing of a wide slotted line on a M0 pad violating the M0 maximum line width and, in a right-hand side, on a M0 grid with some over-etch being present, and shows yet another modification of the process of the invention shown in FIGS. 1 and 2;

FIGS. 6(a)–6(e) illustrate other explanatory views of the process of the present invention, with FIG. 6(a) illustrating the process after C1 lithography-and-etch step, FIG. 6(b) illustrating the process after an M1 lithography step, FIG. 6(c) illustrating the process after M1 etch and resist strip, FIG. 6(d) illustrating a plan view of the structure of 6(c), and FIG. 6(e) illustrating the process after metal fill and chemical mechanical polishing (CMP);

FIG. 7 illustrates a flowchart of the process of forming the via and the slotted line according to the present invention.

DETAILED DESCRIPTION OF A PREFERRED EMBODIMENT OF THE INVENTION

Figure 8:
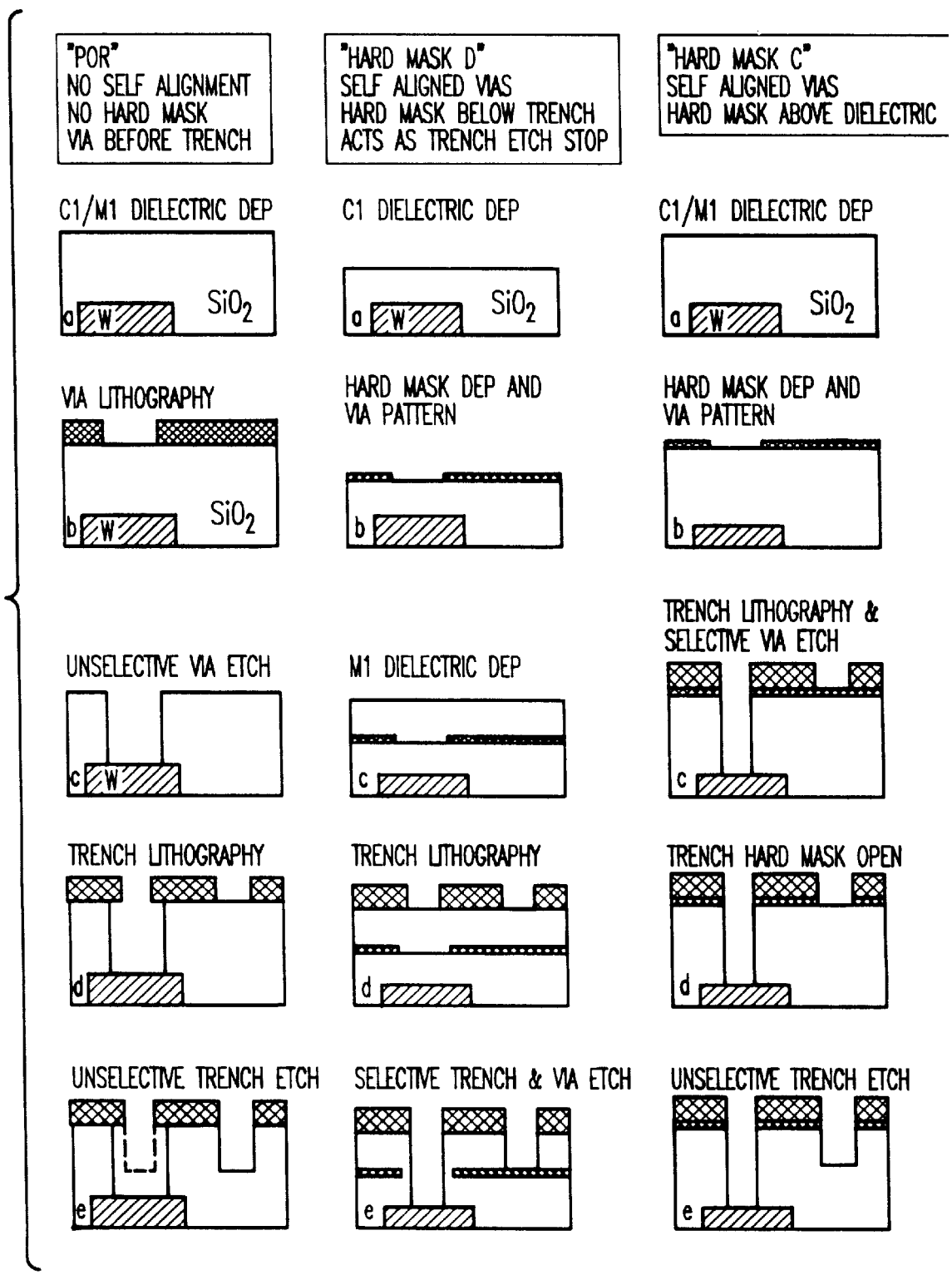
FIG. 8 illustrates other exemplary integration schemes for incorporating the process of the present invention.

Referring now to the drawings, and more particularly to FIGS. 1–7, a preferred embodiment of the invention will he described.

In a lithography process, typically the printing of small circular features is performed in a narrower process window as compared to linear shapes.

Generally, the present invention defines linear features (e.g., slotted lines 1) on a vertical interconnect level (C1) simultaneously with defining the circular vertical interconnects (e.g., vias 2) in an interlevel dielectric 3. The ILD 3 is typically formed on a substrate (not shown) of semiconductor material Thus, as shown in FIG. 1, a low resistive metal line 1 with a height of the interlevel dielectric thickness is formed. The process is described with reference to FIGS. 1, 2, and 6(a)–6(e), and the flowchart of FIG. 7.

In the process of the present invention, the C1 lithography process still focuses on the circular features 2 and will produce the lines 1 without additional adjustments being required or used.

First, in step 700 in FIG. 7, desired linear features 1 and vertical interconnects (VI) 2 are formed in a substrate (e.g., interlevel dielectric 3 formed, for example, of $SiO_2$ or the like. Of course, any dielectric material could be used, and the present invention is not limited to a specific dielectric material for the operability and optimization of the present invention.

Subsequently, in step 701, the lines 1 and vias 2 are etched simultaneously.

The lines 1 are herein called "slotted lines". FIG. 1 illustrates the slotted line 1 and via 2 after simultaneous oxide etching. Preferably, the vias and lines are etched by reactive ion etching (RIE) or the like.

Thereafter, in step 702, a metallization layer M1 (e.g., a horizontal interconnect level layer) is lithographically patterned and etched by RIE or the like.

In step 703, the vias and slotted lines are filled subsequently with (e.g., in) the same metallization process. Thus, the vias and slotted line are filled simultaneously.

Thereafter, in step 704, the filled vias and lines are finished in one common etch (e.g., chemical downstream etching (CDE)) or polish process (e.g., chemical mechanical polishing (CMP)) such that the structure is planarized and has a uniform top surface. The formation of the subsequent HI level (M1) is performed either by metal deposition, lithography and metal etch, or by using a dual damascene approach.

In the dual damascene process, prior to the metal fill of the vias 2, linear trenches 20 are etched into the interlayer dielectric (ILD), as shown in FIG. 2. In one exemplary implementation, the trenches preferably have dimensions substantially within a range of about 0.15 μm to about 5.0 μm wide and a height of approximately one-half of the dielectric's thickness. FIG. 2 shows the via and slotted line after the M1 trench etch in the case of the M1 dual damascene approach.

Then, the via holes 2 and trenches 20 are simultaneously filled with metal and thereafter planarized by chemical mechanical polishing (CMP) or the like. The same fill process is used to fill the slotted lines 1 as well. Consequently, slotted C1 lines are capped with an M1 line.

If a metal etch is used for the M1 line, then the formation of slotted lines 1 is independent from the M1 process. Consequently, a slotted C1 line does not necessarily require being entirely capped by an M1 line.

If a slotted C1 line is capped with an M1 line, then the height of the M1 line adds to the C1 slotted line and further reduces the overall resistance. Thus, the present invention realizes thick metal lines for high current purposes by extending vias 2 (e.g., vertical interconnects) to lines (horizontal interconnects) with no increase in process cost and a saving in chip size.

The inventive process is further shown in FIGS. 6(a)–6(e) in which FIG. 6(a) illustrates the structure after the C1 lithography-and-etch step, FIG. 6(b) illustrates the structure after the M1 lithography step, FIG. 6(c) illustrates the process after the M1 etch and resist strip, FIG. 6(d) illustrates a plan (top) view of the structure after the M1 etch and resist stripping, and FIG. 6(e) shows the structure after metal fill and CMP.

It is noted that, as one of ordinary skill in the art will clearly recognize by taking the present specification as a whole, the concept of "slotted lines" can be applied advantageously to different layers. For example, the concept of slotted lines can be applied to different layers such as, for example, CG (contact-to-gate), CD (contact-to-diffusion layer) and C1 (contact between metals).

It is noted that the crossing of slotted lines with directly underlying and succeeding horizontal interconnect (HI) lines is difficult to achieve without making electrical contact. Hence, further process steps should be introduced to achieve such an object, as discussed below.

Thus, the concept of slotted lines is used preferably for metallization architectures having no less than 2, and more preferably more than 2 (or most preferably more than 3) HI levels. In this case, crossing can be achieved on non-slotted levels. However, using multiple metallization levels, several slotted levels are also possible, realizing for example a C1 slot on top of a CG slot.

Hence, the present invention defines linear features on a VI level (C1) in addition to the circular vertical interconnects. As a result, a low resistance metal line with a height of the ILD thickness is easily and efficiently formed.

In one implementation, the process flow used was similar to an aluminum dual damascene process.

Specifically, the first metal (M0) was built using W dual damascene to form contacts to the substrate and lines of about 150 nm high. Following the intermetal dielectric deposition (e.g., about 930 nM), two etch processes were performed. The first etch formed via openings (C1) all the way down to the underlying metal, and the second etch formed trenches of about 175 nm minimum width (M1 level). Vias and lines were subsequently filled with a metal stack consisting of PVD Ti and CVD TiN liners and a CVD/PVD Al sequence (about 430° C. wafer temperature during PVD). Finally, the metal overburden was removed and planarized by chemical-mechanical polishing (CMP) resulting in approximately 250-nm thick M1 lines.

Unique to the slotted via approach, the C1 mask not only contains the circular openings (vias in array and support), but also a line/space pattern in the support circuits (slotted vias). FIGS. 1, 2, and 6(a)–6(e) depict the process flow for simultaneous formation of vias (left side) and slotted vias (right side).

For the second Al dual damascene level, the previous process sequence was repeated starting with the dielectric deposition. The M2 lines were etched deeper than M1 and having a height of about 380 nm after CMP.

In the implementation above, two types of slotted vias have been built: A) slotted vias fully landing on a pad of the underlying metal layer (C1 slots on M0 or C2 clots on M1), and B) slotted vias without any landing pad. Compared to case A, these slotted vias extend about 300 nm deeper due to the overetch time inherent to the C1 and C2 etch processes.

Slots of type A have been investigated in a width range between about 0.3 μm and 5 μm. The lithographic conditions used to define type A slots are identical to the C1 (C2) via process tuned to print circular openings of about 225 nm diameter (standard illumination conditions). For investigating filling performance in extreme cases, slots of type B have been built down to 175 nm width in 350 nm periodic arrays. For those cases, the lithographic conditions have been slightly modified using annular illumination.

Besides the resistivity of the Al, the sheet resistance of the slots is essentially determined by the total Al height which is in turn controlled by the thickness of the dielectric. The sheet resistance of the M1 (M2) lines can be independently controlled by the M1 (M2) etch depth.

With the exemplary implementation, dual damascene structures of 4:1 aspect ratio were filled on both Al dual damascene levels using the standard metallization. Without any modification in the deposition process, equally good fill was obtained in slotted vias of about 0.3 μm and about 5 μm width. Even slotted vias as narrow as about 175 nm (type B) with aspect ratios of >5:1 were perfectly filled. Continuity measurements performed on about a 3-m long and about 175 nm wide slotted via of type B exhibited excellent yield and a tight current distribution.

It is noted that it is more difficult to achieve good fill of slotted vias of intermediate width in the range between 0.5 μm and 2.5 μm. Here, the slotted vias are pinched off during the initial Al deposition and the reflow of the Al during the PVD deposition does not succeed in filling the voids. For slotted vias smaller than 0.5 μm, pinch-off either does not occur or the voids are small enough to be filled during the reflow step.

In the case of slotted vias, the void density depends on the arrangement of the slotted vias. For example, in 1-μm-wide slotted vias forming a grid pattern, it was observed that the voiding was suppressed. In a parallel arrangement of 1-μm- wide slotted vias, the density of voids depends on the pattern factor PF (e.g., defined as metal line width divided by pitch). While a high density of voids was observed in an array of 1-µm-wide slots with PF=50%, no voids were observed for PF 90%.

Regarding the sheet resistance of M2 damascene lines and C1 slotted vias over a broad line width range, the voiding in slots of intermediate width was reflected in an increased sheet resistance for lines around a 1 µm width.

In a comparison of the topography after CMP as measured on test fields with varying width and pattern factor for M1 lines and C1 slotted vias, both line width and pattern factor were found to play an important role for metal CMP processes. Wide lines have the tendency to dish out. As a result, the topography increases strongly for wider lines. On the other hand, regions of high pattern factor exhibit an increased removal rate for metal and dielectric due to the small stability provided by narrow spacing between metal lines. This in turn leads to an increased topography for smaller line width (and therefore spacing). Generally, the topography on top of slotted vias is considerably higher than on shallow damascene lines. The reason for this is that the overburden of metal before CMP is smaller on top of slotted vias as compared to shallow lines. This results in more dishing and increased topography for the slotted vias. However, due to the slotted vias of the invention being deeper, their sheet resistance is less affected by dishing and is less dependent on pattern factor.

Both the voiding related to slotted vias of intermediate width as well as the increased topography on top of arrays of slotted vias can be improved by optimizing the metallization sequence and the Al thickness. For the sake of process simplicity and minimized cost, however, preferably slotted vias of intermediate width and high pattern factor are avoided altogether by according suitable design rules. Even with a restrictive design rule set, using slotted vias is still a major improvement for chip-size-optimized interconnect design.

Modifications to the First Embodiment

Several variations of the basic process according to the present invention described above are possible concerning the metal M0 preceding the C1 level and the metal M1 succeeding the C1 level.

For example, in a first modification, in which the slotted lines do not have an underlying M0 metal line and no etch stop layer is introduced, the C1 etch is not self-terminating and must be performed in a time-controlled manner. An advantage to this modification is that the slot can continue even deeper than the M0 level. However, there may be unintentionally long overetching, thereby leading to destruction of underlying levels of the chip architecture, which would affect yield and process efficiency.

In a second modification of the above process, as shown in FIG. 3, an insulating etch stop layer 30 is introduced below the ILD 3. Preferably, the layer 30 has a thickness substantially within a range of about 50 µm to about 100 µm. Preferably, the insulating layer is SiN, but other insulating materials also can be employed.

Etch stop layer 30 must be patterned by a separate lithography-and-etch step below the C1 via prior to the C1 metal fill, as shown in FIG. 3. An advantage to this modification is that the M0 line can cross the C1 slotted line without making electrical contact therewith.

In a third modification, as shown in FIG. 4, if a metal etch is used to form the metal lines of the succeeding metal level M1, then an insulating layer 40 can be deposited after the planarization of the C1 metal. Preferably, the layer 40 has a thickness substantially within a range of about 10 µm to about 50 µm. Preferably, the insulating layer is SiN, but as mentioned above other insulating materials also may be employed.

Insulation layer 40 is preferably patterned by a separate lithography-and-etch step on top of the C1 vias prior to M1 metal deposition, as shown in FIG. 4. An advantage of the third modification of the preferred embodiment is that a M1 line can cross the C1 slotted line without making electrical contact therewith.

In a fourth modification, the slotted line is landing on an underlying M0 line. In this case, the height of the M0 line adds to the entire metal stack and reduces the resistance further. If the M0 line is formed by a damascene technique, it might be constrained by a design rule limiting its maximum line width to a predetermined value. (Such a restriction results from sheet resistance increase of damascene lines due to dishing of the polishing process). In this case, the following additional variations could be employed.

First, the maximum line width 50 can be set higher if the M0 line is used below the slotted C1 line, as shown in the lefthand portion (a) of FIG. 5. Specifically, the M0 sheet resistance is negligibly below a slotted C1 line since the slotted lines have a much lower line resistance.

Secondly, the M0 line landing pad can be designed as a grid of lines obeying each maximum line width ground rule. The slotted line etch will stop on the M0 lines. Due to the reduced reactive ion etching (RIE) rate in small and buried features, it will only negligibly continue to etch between the gridlines during the over-etch time, as shown in the righthand portion (b) of FIG. 5. The voids formed between the gridlines will not go deep enough to cause further damage and will be filled by the C1 metal fill in subsequent processing. Thus, the wide slotted line on a M0 grid will have little over-etch 51.

Thus, with the unique process of the invention and the concept of defining horizontal interconnects on via levels, low capacitance/high resistance lines and low resistance/high capacitance lines can be combined on all metallization levels. As a result, a significant decrease in chip area occurs, without adding mask levels and the like. Using an Al dual damascene scheme slotted vias with sheet resistance as low as 0.04 Ohm/square and independent of the metal pattern factor have been built.

While the invention has been described in terms of a single preferred embodiment and several modifications thereto, those skilled in the art will recognize that the invention can be practiced with modification within the spirit and scope of the appended claims.

For example, the concept of using slotted vias is not limited to Al dual damascene and is extendible to other materials and integration schemes such as Cu dual damascene or Al plugs.

Further, while the implementations and modifications mentioned above have been realized using the integration scheme depicted in FIGS. 6(a)–6(e), it is noted that the present invention is not limited to this integration scheme. Indeed, any other process flow that would be conventionally used to integrate vertical and horizontal interconnects can be extended in the spirit of the present invention by including horizontal lines in the VI level.

For example, other exemplary integration schemes for dual damascene process flows are illustrated in FIG. 8 (e.g., see middle and right process flows) where the VI level is patterned using a hard mask either embedded into the interlevel dielectric or deposited on top of it.

In contrast to the process used for the exemplary implementations mentioned above (e.g., depicted on the left side in FIG. 8), both schemes including the use of the hard masks require the slots to be defined both on the VI level (C1) and on the subsequent HI level (M1).

What is claimed is:

1. A process of forming a wiring in a semiconductor interlayer dielectric, comprising:
   simultaneously patterning a via and a slotted line, separate from said via, in said interlayer dielectric;
   simultaneously etching the via and the slotted line;
   etching a trench in said interlayer dielectric to provide a connection to the via thereby forming a combined trench and via; and
   simultaneously filling the via, the trench, and the slotted line with a metal to form a filled trench, filled via and a filled metal line,
   wherein said filled metal line has a thickness substantially equal to a thickness of said interlayer dielectric.

2. The process according to claim 1, further comprising planarizing the filled trench, filled via and the filled slotted line.

3. The process according to claim 1, further comprising polishing the filled tench, filled via and the filled slotted line.

4. The process according to claim 1, further comprising planarizing the filled trench, filled via and the filled slotted line, and polishing the filled trench, filled via and the filled slotted line.

5. A process of forming a wiring in a semiconductor interlayer dielectric comprising:
   simultaneously patterning a via and a slotted line in said interlayer dielectric;
   simultaneously etching the via and the slotted line;
   etching a trench in said interlayer dielectric to provide a connection to the via thereby forming a combined trench and via;
   simultaneously filling the via, the trench, and the slotted line with a metal to form a filled trench, filled via and a filled metal line; and
   stacking a second slotted line on said slotted line.

6. A method of forming a metal wiring in a semiconductor device, comprising:
   simultaneously defining a linear feature on a vertical interconnect level and a vertical interconnect in a substrate of the semiconductor device;
   simultaneously forming a line and a via, separate from said line, in the substrate;
   simultaneously etching the line and the via;
   etching a trench in the substrate to provide a connection to the via for forming an interconnect;
   simultaneously filling the line and the via with a metal to form the linear feature and the vertical interconnect and simultaneously filling the trench to form a horizontal interconnect; and
   planarizing said linear feature and said vertical interconnect,
   wherein a filled metal line has a thickness substantially equal to a thickness of said substrate.

7. The method according to claim 6, wherein said etching comprises an oxide etching.

8. The method according to claim 6, wherein said planarizing comprising one of a common etching and a chemical mechanical polishing.

9. The method according to claim 6, further comprising:
   forming a subsequent metallization level covering said linear feature and said via, by one of metal deposition, lithography and metal etching, and by using a dual damascene process.

10. The method according to claim 6, wherein said substrate comprises an interlayer dielectric (ILD).

11. The method according to claim 6, further comprising:
    capping said linear feature with a metal line.

12. The method according to claim 11, wherein capping said linear feature comprises using a metal etch for the metal line, whereby the forming of the linear feature is independent from forming of the metal line, and
    wherein the linear feature is partially covered by the metal line.

13. The method according to claim 11, wherein capping said linear feature comprises using a metal etch for the metal line, whereby the forming of the linear feature is independent from forming of the metal line, and
    wherein the linear feature is entirely covered by the metal line.

14. The method according to claim 6, wherein a metallization architecture of said device includes no less than two horizontal interconnect levels.

15. The method according to claim 14, wherein said metallization architecture includes more than two levels.

16. The method according to claim 15, wherein said metallization architecture includes more than three levels.

17. The method according to claim 14, wherein said substrate comprises an interlevel dielectric layer, and wherein said metal wiring has a height of the interlevel dielectric layer thickness.

18. The method according to claim 6, wherein, when the line has no underlying metal line and no etch stop layer is introduced, said simultaneous etching is performed in a time-controlled manner.

19. The method according to claim 6, further comprising:
    forming an insulating etch stop layer below said substrate, said forming of the insulating etch stop layer comprising a separate lithography-and-etch step prior to said filling said line and said via with metal.

20. The method according to claim 6, further comprising:
    forming an insulating layer after planarizing the linear feature and the via; and
    forming a metal line of a succeeding metal level using metal etching.

21. The method according to claim 20, wherein said insulating layer is formed by a separate lithography and etch step on top of the linear feature and the via.

22. A method of forming a metal wiring in a semiconductor device, comprising:
    simultaneously defining a linear feature on a vertical interconnect level and a vertical interconnect in a substrate of the semiconductor device;
    simultaneously forming a line and a via in the substrate;
    simultaneously etching the line and the via;
    etching a trench in the substrate to provide a connection to the via for forming an interconnect;
    simultaneously filling the line and the via with a metal to form the linear feature and the vertical interconnect and simultaneously filling the trench to form a horizontal interconnect; and planarizing said linear feature and said vertical interconnect, wherein said linear feature is formed on an underlying metal line, such that a height of the metal line adds to a height of an entire metal stack to reduce resistance.

23. The method according to claim 22, wherein a landing pad of the metal line includes a grid of lines such that the etching of the linear feature stops on the grid lines of the metal line.

24. A method of forming a metal wiring in a semiconductor device, comprising:

simultaneously defining a linear feature on a vertical interconnect level and a vertical interconnect in a substrate of the semiconductor device;

simultaneously forming a line and a via in the substrate;

simultaneously etching the line and the via;

etching a trench in the substrate to provide a connection to the via for forming an interconnect;

simultaneously filling the line and the via with a metal to form the linear feature and the vertical interconnect and simultaneously filling the trench to form a horizontal interconnect;

planarizing said linear feature and said vertical interconnect; and stacking a second line on said line.

25. The method according to claim 24, wherein said first and second lines each comprise a slotted line.

* * * * *